US009263262B2

(12) United States Patent
Auner et al.

(10) Patent No.: US 9,263,262 B2
(45) Date of Patent: Feb. 16, 2016

(54) NANOWIRES MADE OF NOVEL PRECURSORS AND METHOD FOR THE PRODUCTION THEREOF

(75) Inventors: Norbert Auner, Glashuetten (DE); Christian Bauch, Muldenstein (DE); Rumen Deltschew, Leipzig (DE); Sven Holl, Gueckingen (DE); Javad Mohsseni, Halle / Saale (DE); Gerd Lippold, Leipzig (DE)

(73) Assignee: Spawnt Private S.à.r.l., Luxembourg (LU)

( * ) Notice: Subject to any disclaimer, the term of this patent is extended or adjusted under 35 U.S.C. 154(b) by 106 days.

(21) Appl. No.: 13/696,137

(22) PCT Filed: May 5, 2011

(86) PCT No.: PCT/EP2011/057253
§ 371 (c)(1),
(2), (4) Date: Apr. 15, 2013

(87) PCT Pub. No.: WO2011/138418
PCT Pub. Date: Nov. 10, 2011

(65) Prior Publication Data
US 2013/0214243 A1    Aug. 22, 2013

(30) Foreign Application Priority Data

May 5, 2010   (DE) .......................... 10 2010 019 565
May 7, 2010   (DE) .......................... 10 2010 019 874

(51) Int. Cl.
| | | |
|---|---|---|
| H01L 21/02 | (2006.01) |
| B82Y 30/00 | (2011.01) |
| C01B 33/027 | (2006.01) |
| C01B 33/03 | (2006.01) |
| C01G 17/00 | (2006.01) |
| C30B 25/00 | (2006.01) |
| C30B 29/06 | (2006.01) |
| C30B 29/08 | (2006.01) |
| C30B 29/52 | (2006.01) |
| C30B 29/60 | (2006.01) |
| C01B 33/107 | (2006.01) |
| H01L 31/0352 | (2006.01) |
| H01L 29/12 | (2006.01) |
| B82Y 10/00 | (2011.01) |
| B82Y 40/00 | (2011.01) |
| H01L 29/06 | (2006.01) |

(52) U.S. Cl.
CPC ............ *H01L 21/0262* (2013.01); *B82Y 10/00* (2013.01); *B82Y 30/00* (2013.01); *B82Y 40/00* (2013.01); *C01B 33/027* (2013.01); *C01B 33/03* (2013.01); *C01B 33/1071* (2013.01); *C01B 33/10773* (2013.01); *C01G 17/00* (2013.01); *C30B 25/00* (2013.01); *C30B 29/06* (2013.01); *C30B 29/08* (2013.01); *C30B 29/52* (2013.01); *C30B 29/60* (2013.01); *H01L 21/02532* (2013.01); *H01L 21/02576* (2013.01); *H01L 21/02579* (2013.01); *H01L 21/02603* (2013.01); *H01L 21/02653* (2013.01); *H01L 29/0669* (2013.01); *H01L 29/125* (2013.01); *H01L 31/035227* (2013.01); *C01P 2004/16* (2013.01); *C01P 2004/61* (2013.01); *C01P 2004/62* (2013.01); *C01P 2004/64* (2013.01)

(58) Field of Classification Search
USPC .................................. 257/741, 616; 977/762
See application file for complete search history.

(56) References Cited

U.S. PATENT DOCUMENTS

| | | | |
|---|---|---|---|
| 7,776,760 B2 * | 8/2010 | Taylor ........................... 438/758 |
| 8,507,381 B2 * | 8/2013 | Renard et al. ................. 438/680 |
| 2003/0106581 A1 | 6/2003 | Shibuya et al. |
| 2013/0214243 A1 * | 8/2013 | Auner et al. ...................... 257/9 |

FOREIGN PATENT DOCUMENTS

| | | |
|---|---|---|
| EP | 2 246 298 | 11/2010 |
| JP | 2006-117475 | 5/2006 |
| JP | 2007-055840 | 3/2007 |
| JP | 2008-305982 | 12/2008 |
| WO | 2007/136412 | 11/2007 |
| WO | 2009/055181 | 4/2009 |
| WO | 2009/143823 | 12/2009 |
| WO | 2009/143824 | 12/2009 |

OTHER PUBLICATIONS

Akthar, S. et al., "Influence of the Crystal Orientation of Substrate on Low Temperature Synthesis of Silicon Nanowires from $Si_2H_6$," *Thin Solid Films*, 2008, pp. 317-319.
Garnett, E.C. et al., "Growth and Electrical Characteristics of Platinum-Nanoparticle-Catalyzed Silicon Nanowires," *Adv. Mater.*, 2007, vol. 19, pp. 2946-2950.
Ge, S. et al., "Orientation-Controlled Growth of Single-Crystal Silicon-Nanowire Arrays," *Adv. Mater.*, 2005, vol. 17, No. 1, pp. 56-61.
Heitsch, A.T. et al., "Solution-Liquid-Solid (SLS) Growth of Silicon Nanowires," *J. Am. Chem. Soc.*, 2008, vol. 130, pp. 5436-5437.

(Continued)

*Primary Examiner* — Mark Prenty
(74) *Attorney, Agent, or Firm* — DLA Piper LLP (US)

(57) ABSTRACT

The invention relates to nanowires which consist of or comprise semiconductor materials and are used for applications in photovoltaics and electronics and to a method for the production thereof. The nanowires are characterized in that they are obtained by a novel method using novel precursors. The precursors represent compounds, or mixtures of compounds, each having at least one direct Si—Si and/or Ge—Si and/or Ge—Ge bond, the substituents of which consist of halogen and/or hydrogen, and in the composition of which the atomic ratio of substituent:metalloid atoms is at least 1:1.

4 Claims, No Drawings

(56) References Cited

OTHER PUBLICATIONS

Park, W. II et al., "Controlled Synthesis of Millimeter-Long Silicon Nanowires with Uniform Electronic Properties," *Nano Letters*, 2008, vol. 8, No. 9, pp. 3004-3009.

Sharma, S. et al., "Diameter Control of Ti-Catalyzed Silicon Nanowires," *Journal of Crystal Growth*, 2004, vol. 267, pp. 613-618.

Tuan, H-Y. et al., "Catalytic Solid-Phase Seeding of Silicon Nanowires by Nickel Nanocrystals in Organic Solvents," *Nano Letters*, 2005, vol. 5, No. 4, pp. 681-684.

Zhang, Y. et al., "Synthesis of Thin Si Whiskers (Nanowires) Using $SiCl_4$," *Journal of Crystal Growth*, 2001, vol. 226, pp. 185-191.

English translation of Singapore Examination Report dated Nov. 10, 2014 from corresponding Singapore Patent Application No. 2012081030.

Molnar, W. et al., "Sub-Eutectic Synthesis of Epitaxial Si-NWs with Diverse Catalysts Using a Novel Si Precursor," *Nano Letters*, 2010, pp. 1-13.

Chan, C.K. et al., "High-Performance Lithium Battery Anodes Using Silicon Nanowires," *Nature Nanotechnology*, 2008, vol. 3, pp. 31-35 (3 sheets of Abstract only).

Bonitz, E., "Ein neuer Weg zur Herstellung von aktivem Silicium oder Silliciummonochlorid," Chemische Berichte, 1961, vol. 94, pp. 220-225 (3 sheets of English translation of Abstract).

\* cited by examiner

NANOWIRES MADE OF NOVEL PRECURSORS AND METHOD FOR THE PRODUCTION THEREOF

RELATED APPLICATIONS

This is a §371 of International Application No. PCT/EP2011/057253, with an international filing date of May 5, 2011, which is based on German Patent Application No. 10 2010 019 565.0, filed May 5, 2010, and German Patent Application No. 10 2010 019 874.9, filed May 7, 2010, the subject matter of which is incorporated by reference.

TECHNICAL FIELD

This disclosure relates to nanowires which consist of or comprise semiconductor materials and serve for applications in photovoltaics and electronics, and also to a method for production thereof.

BACKGROUND

Thermal decomposition of gaseous silicon precursor compounds for the production of silicon nanowires is known. Besides various silicon compounds, catalytically active metals are employed. Generally speaking, catalyst metal agglomerates of a few nanometers in diameter are produced first, and then act catalytically on the decomposition of the silicon compounds and contribute to the ordered deposition of the elemental silicon formed. Depending on the reaction conditions, the resulting nanowires are crystalline or wholly or partly amorphous. It is preferred to use metals which exhibit eutectic mixtures with a low melting temperature with silicon. The model conception says that, under the reaction conditions, a liquid metal/Si mixture is formed, from which, finally, solid Si deposits as a result of further uptake of Si from the precursor compounds as they decompose. However, a comparable growth behavior is also observed even at temperatures below the eutectic melting point. Silicon nanowires are deposited predominantly on substrates such as silicon or such as metal oxides, an example being $Al_2O_3$.

For example, E. C. Garnett, W. Liang, and P. Yang, Advanced Materials 2007,79,2946, describe the production of silicon nanowires by CVD deposition from $SiCl_4/H_2$ with Pt as a catalyst metal under atmospheric pressure and at 805° C. Y. Zhang, Q. Zhang, N. Wang, Y. Yan, H. Zhou, and J. Zhu, Journal of Crystal Growth 226 (2001), pp 185-191, use a similar method under atmospheric pressure with an optimized temperature of 900° C., with Ni as a catalyst metal.

It is known that for the epitaxial deposition of silicon nanowires on crystalline silicon it is necessary first to remove the oxide layer of the substrate. Where chlorosilanes are used as precursor compounds, there is formation, together with hydrogen additionally present, of HCl, which reacts with the oxide layer (S. Ge, K. Jiang, X. Lu, Y. Chen, R. Wang, and S. Fan, Advanced Materials 2005, 17, 56). When chlorine-free precursor silanes are used, the same effect can be achieved by admixing HCl (S. Sharma, T. T. Kamins, and R. S. Williams, Journal of Crystal Growth 2004, 261, 613). For example, WO 2001/136412, after the production of suitable catalyst metal agglomerates, claims the successive use of at least two different precursor gas mixtures, of which the first mixture comprises either a chlorine-containing silane or, in addition to a silane, another chlorine source, and which ensures the start of growth, but requires comparatively high temperatures for the decomposition. Thereafter, the reaction temperature is lowered and a second precursor gas is used which has a lower decomposition temperature. Suitable precursor compounds cited are $SiH_4$, $Si_2H_6$, $SiCl_4$, and $SiH_2Cl_2$. Examples of suitable catalyst metals are Au, Al, Pt, Fe, Ti, Ga, Ni, Sn, or In. In addition to the conventional CVD technique for producing silicon nanowires, there are also references to Plasma Enhanced Sputter Deposition and Plasma Enhanced CVD, which allow a reduction in the reaction temperature.

W. I. Park, G. Zhenq, X-Jiang, B. Tian, and C. M. Lieber, Nano Letters 2008, 8, 3004, describe how at 400° C. and 10 torr pressure, the growth rate of silicon nanowires with Au as catalyst is 130 times greater for disilane, $Si_2H_6$, than for $SiH_4$. Even with reaction temperatures optimized for $SiH_4$, the growth rate lags behind that starting from disilane by a factor of 31. S. Akhtar, A. Tanaka, K. Usami, Y. Tsuchiya, and S. Oda, Thin Solid Films 2008, 517, 317, show that nanowires can be produced from $Si_2H_6/H_2$ using Au catalyst even at a temperature of 350° C. and under a pressure of 3 torr. For example, JP 2006117475 A and JP 2007055840 A describe the production of Si nanowires at temperatures as low as 250-300° C., using disilane and trisilane as silicon sources, employing the metals Au, Ag, Fe, and/or Ni as catalysts, and setting a pressure during the reaction of 1-5 torr.

H.-Y. Tuan, D. C. Lee, T. Hanrath, and B. A. Korgel, Nano Letters 2005, 5, 681, show that formation of Si nanowires takes place even without a substrate in supercritical organic solvents at 400-520° C. and a pressure of 14.3-23.4 MPa. The catalyst metal used is Ni and, in addition to trisilane, $Si_3H_8$, the precursor compounds employed include octylsilane and phenylsilane. A. T. Heitsch, D. D. Fanfair, H.-Y. Tuan, and B. A. Korgel, Journal of the American Chemical Society 2008, 130, 5436, show that for trisilane as a precursor molecule, this reaction leads to Si nanowires even under atmospheric pressure and at boiling temperature (420-430° C.) with high-boiling organic solvents.

A disadvantage of the use of silanes ($Si_nH_{2n+2}$) is their pyrophoric properties (self-ignitability in air), which hinder handling.

It could therefore be helpful to provide innovative nanowires by a new method from suitable precursors of the specified kind that are new for this purpose, as well as to provide a method for producing such nanowires.

SUMMARY

We provide nanowires consisting of or including semiconductor materials for applications in photovoltaics and electronics, produced from precursors which constitute compounds or mixtures of compounds each having at least one direct Si—Si and/or Ge—Si and/or Ge—Ge bond, with substituents consisting of halogen and/or hydrogen and with a composition in which an atomic ratio of substituents to metalloid atoms is at least 1:1.

We also provide a method for producing nanowires by reacting precursors, or precursors and hydrogen at a precursor:hydrogen mixing ratio of 1:0 to 1:1,000,000.

We further provide a method for producing nanowires by reacting precursors, or precursors and hydrogen, wherein different precursors for the growth are used in temporal alternation, the precursors being switched at least once during the process.

We additionally provide a method for producing nanowires by reacting precursors, or precursors and hydrogen, wherein nanowires having compositions which alternate in growth direction are obtained.

DETAILED DESCRIPTION

Precursors for the growth of nanowires are silicon and/or germanium-containing compounds which are converted into elemental silicon and/or germanium under the process conditions.

Polysilanes are compounds having at least one Si—Si bond. According to one example, polysilanes are halogenated and hydrogenated polysilanes and also polysilanes having organic substituents, and the corresponding partially halogenated and partially hydrogenated polysilanes, having the following general formula: $Si_nX_aH_b$, where a+b is greater than or equal to 2n and less than or equal to 2n+2, a and b are each greater than or equal to 0, and X=halogen, amine substituent or organic radical such as alkyl radicals, for example, more particularly methyl. It is also possible, furthermore, to use polysilanes with organic substituents for SiC nanowires, or with amine substituents for SiN nanowires. It is also possible, furthermore, to use polysilanes having (transition) metal substituents.

Polygermanes are compounds having at least one Ge—Ge bond. According to one example, the polygermanes are halogenated and hydrogenated polygermanes and also the corresponding partially halogenated and partially hydrogenated polygermanes, having the following general formula: $Ge_nX_aH_b$, where a+b is greater than or equal to 2n and less than or equal to 2n+2, a and b each being greater than or equal to 0, and X=halogen, amine substituent or organic radical, such as alkyl radicals, for example, more particularly methyl. Furthermore, polygermanes with organic substituents can also be used for GeC nanowires, or, with amine substituents for GeN nanowires. It is also possible, furthermore, for polygermanes having (transition) metal substituents to be used.

Polygermasilanes are compounds having at least one Si—Ge bond. According to one example, polygermasilanes are halogenated and hydrogenated polygermasilanes, and also the corresponding partially halogenated and partially hydrogenated polygermasilanes, having the following general formula: $Si_{n-z}Ge_zX_aH_b$ or $Si_zGe_{n-z}X_aH_b$, where a+b is greater than or equal to 2n and less than or equal to 2n+2, a and b each being greater than or equal to 0, n is greater than z, and X=halogen, amine substituent or organic radical, such as alkyl radicals, for example, more particularly methyl. Additionally it is also possible to use polygermasilanes having organic substituents for SiGeC nanowires, or having amine substituents for SiGeN nanowires. Additionally it is also possible to use polygermasilanes having (transition) metal substituents.

By p-doped precursors is meant that the respective compound/the mixture comprises a fraction of p-doping atoms such as boron, aluminum, gallium, or indium, preferably boron atoms, that is useful for the desired semiconductor properties of the deposition product (e.g., Fermi level), it being possible for these atoms either to be incorporated into the precursor molecules or to be admixed as separate compounds to the precursors.

By n-doped precursors is meant that the respective compound/the mixture comprises a fraction of n-doping atoms such as nitrogen, phosphorus, arsenic, antimony, or bismuth, preferably phosphorus atoms, that is useful for the desired semiconductor properties of the deposition product (e.g., Fermi level), it being possible for these atoms either to be incorporated into the precursor molecules or to be admixed as separate compounds to the precursors.

Further doping elements may be taken from the groups of the Periodic Table of the Elements to the left and right of main group 4 (group 14), preferably from groups 13 and 15.

Monosilanes and monogermanes are all compounds having in each case only one silicon atom or one germanium atom. $SiX_aH_b$ and $GeX_aH_b$, where a+b is 4, and a and b are each greater than or equal to 0.

The term "metalloid atoms" refers to atoms of the semimetals silicon and germanium.

The expressions " . . . consist of halogen . . . " or " . . . consist of hydrogen . . . " mean that apart from minor other constituents (<1% by mass), the substituents consist exclusively of halogen or of hydrogen, respectively.

By "predominantly" is meant that the constituent in question is present in the mixture to an extent of more than 80% by mass.

"Virtually no[ne]" means that a secondary constituent is present at less than 5% by mass in a mixture.

A feature of the nanowires is that they are obtained by an innovative method using innovative precursors. The precursors constitute compounds or mixtures of compounds each having at least one direct Si—Si and/or Ge—Si and/or Ge—Ge bond with substituents which consist of halogen and/or hydrogen and with a composition in which the atomic ratio of substituents to metalloid atoms is at least 1:1.

Our nanowires are notable for the fact that the innovative precursors used are liquid under standard conditions (room temperature, atmospheric pressure) with one exception ($Si_2H_6$) and are soluble in numerous solvents, meaning that they can be handled more easily and securely than many conventional precursors such as monosilane, for example. Examples of solvents which are inert relative to the precursors are monochlorosilanes such as $SiCl_4$, liquid alkanes such as hexane, heptane, pentane, and octane, and also aromatics such as benzene, toluene, and xylene, for example.

Particularly preferred precursors are the highly chlorinated polysilanes, polygermanes, polygermasilanes, more particularly $Si_nHal_{2n+2}$ with Hal=Cl, F, Br, or I, preference being given to using $Si_nCl_{2n+2}$ with n=2-10, more preferably with n=2-5. Polygermanes which can be used are, generally, compounds of the general formula $Ge_nHal_{2n+2}$, with Hal=Cl, F, Br, or I, preferably $Ge_nCl_{2n+2}$. Polygermasilanes which can be used are compounds of the general formula $Si_{n-x}Ge_xHal_{2n+2}$ or $Si_xGe_{n-x}Hal_{2n+2}$ with n>x, it being possible for the parameter n in the case of the polygermanes and polygermasilanes to be n=2-10, more preferably n=2-5.

The nanowires may be obtained from precursors which contain virtually no rings, the amount of rings, based on the overall product mixture, being below <2% by mass.

The nanowires may be obtained from precursors which contain virtually no branched chains, the amount of branching sites, based on the overall product mixture, being below <5% by mass, preferably <2% by mass. It is possible, for example, to use halogenated polysilanes having a low fraction of rings and having chains with low degrees of branching, these polysilanes being of the kind described in PCT application WO2009/143823 A2, the subject matter of which is hereby incorporated by reference in relation to their properties and synthesis.

Furthermore, the nanowires may be obtained from precursors which consist predominantly of branched chains. It is possible, for example, to use halogenated polysilanes having a high fraction of rings and having branched chains, of the kind described in PCT application WO 2009/143824 A1, the subject matter of which is hereby incorporated by reference in relation to their properties and synthesis.

It is possible to obtain nanowires from precursors whose substituents consist exclusively of hydrogen. In this case, for example, polysilanes, polygermanes or polygermasilanes of the general formulae $Si_nH_{2n+2}$, $Ge_nH_{2n+2}$ and/or $Si_{n-x}$ $Ge_xH_{2n+2}$ or $Si_xGe_{n-x}H_{2n+2}$ with n>x with n=3-10, more preferably with n=3-5, can be used as precursors. It is also possible to use cyclic polysilanes, polygermanes and polygermasilanes having the general formulae $Si_nH_{2n}$, $Ge_nH_{2n}$, and/or $Si_{n-x}Ge_xH_{2n}$ or $Si_xGe_{n-x}H_{2n}$, with n>x with n=3-10, more preferably with n=4-6.

The gas mixture (precursor and carrier gas and/or hydrogen) may additionally be diluted with an inert gas such as helium, neon, argon, krypton, xenon, or nitrogen, for example, and/or may comprise further admixtures (additives) such as doping additives, examples being liquid or solid boron compounds, metallic compounds or phosphorus compounds, for example. Examples are $BBr_3$, $TiCl_4$, or $PCl_3$. Admixing inert gases is, however, not mandatory.

The deposition temperatures lie between 250-1100° C., preferably between 330 to 950° C.

Nanowires can be obtained from the precursors without the presence of hydrogen in free or bonded form being necessary during the deposition since there are other semiconductor-yielding reactions present, as for example: $Si_3Cl_8 \rightarrow 2SiCl_4 + Si$, $Ge_3Cl_8 \rightarrow 2GeCl_4 + Ge$, $3GeSi_2Cl_8 \rightarrow 4SiCl_4 + 2GeCl_4 + GeSi_2$. This is possible through use of highly halogenated, more particularly highly chlorinated, polysilanes of the general formula $Si_nCl_{2n+2}$ with n=2-10, more preferably with n=2-5, or by using the corresponding highly halogenated, more particularly high chlorinated, polygermanes or polygermasilanes.

The reaction pressures are 0.1 hPa to 2200 hPa, preferably at 1 hPa to 1100 hPa, more preferably 200 hPa to 1100 hPa.

The partial pressures of the precursors may be adjusted in a simple way by varying the temperatures of the reservoir vessel and also by admixing further gas components.

Metallic catalysts employed for the deposition of the nanowires include metals such as bismuth, preferably transition metals such as Cu, Ag, Ni, and Pt, for example, or else Au, or mixtures thereof.

By using the precursors it is possible to employ catalysts which do not affect the electronic properties of the nanowires. Ni and Pt particularly are compatible with typical metal oxide semiconductor technologies.

The innovative precursors are able to be decomposed over the metallic catalysts to form the corresponding elements as, for example, Si or Ge, and/or alloys as, for example, Si—Ge alloys, and so form the nanowires.

The particle sizes (diameters) of the catalysts are 5 nm to 1000 nm, preferably 20 nm-200 nm, and can be determined by an electron microscope, for example.

The nanowires possess diameters in the range of 50 to 1200 nm and lengths in the range of 100 to 100,000 nm, and other dimensions are obtainable as well by varying the growth times.

The growth rates are 5 nm to 5000 nm per minute.

By using the precursors and/or at low process temperatures of below 600° C. during formation of the nanowires, the growth of the nanowires can also be carried out without formation of hydrogen halide, thereby exerting an influence also on the etching behavior and the epitaxially associated orientation of the nanowires.

The precursors are preferably suitable both for the gas/liquid/solid phase growth process and for the gas/solid/solid phase growth process. In the case of the gas/liquid/solid phase growth process, a liquid eutectic mixture is formed from the metal and the semimetal element (e.g., gold/silicon), from which silicon deposits on the solid wire and in which fresh silicon dissolves by decomposition of the precursors in the gas phase. In the case of the gas/solid/solid phase growth process, a solid alloy of the semimetal element in the metal is formed by the dissolution of the element after decomposition of the precursor and also by the deposition from the solid alloy onto the nanowire as a result of diffusion processes in the solid alloy.

By using the precursors, such as the highly halogenated polysilanes, polygermanes or polygermasilanes, for example, it is possible to obtain hydrogen-free nanowires since the use of hydrogen is not necessary to produce the nanowires.

A further feature of the nanowires is that the innovative precursors used may be designed preferably as single-source precursors for doped semiconductor regions. As a result of this it is possible to do away with the use of toxic or otherwise hazardous dopants such as phosphine and diborane, for example, which in conventional doping processes necessitate the use of costly gas supply and safety systems. Therefore, it is possible to produce the nanowires using exclusively the precursors, without additional reactive gases such as hydrogen, for example.

Moreover, a feature of the nanowires is that the innovative precursors used can be used in temporal alternation, i.e., for example, p-doped and n-doped precursors alternately, for the growth, with the precursors being switched at least once during the process. In this way it is possible to obtain, for example, differently doped regions preferably in alternation in the longitudinal direction, more particularly p/n junctions, which are important, for example, for the photovoltaic effect. In a corresponding way it is also possible, furthermore, to produce alternating regions having different Si:Ge ratios.

In addition it is possible to obtain nanowires having compositions which alternate in growth direction. For this purpose, different precursors/precursor mixtures can be provided in alternation during growth. As a result it is possible to obtain, for example, different dopings or alloys in a crystal of a nanowire.

A further feature of the method for producing nanowires is that during deposition of the nanowires, besides the nanowires, less than 10% of pulverulent by-products, comprising, for example, the elemental semimetals Si or Ge, are deposited in the deposition region of the nanowires. These unwanted by-products may be formed as a result of unwanted, uncatalyzed decomposition of the precursors.

All of the precursors can also be used for the epitaxial growth of nanowires on crystalline Si substrates.

WORKING EXAMPLE

Using highly chlorinated polysilanes of the formula $Si_nCl_{2n+2}$ with n=2-10, such as $Si_3Cl_8$, for example, as precursors, and with Au as metallic catalyst, nanowires can be produced with decomposition of the precursors at temperatures between 400° C. to 900° C. Besides the precursors, only helium, as inert gas, was present, and so the nanowires were produced in particular in the absence of hydrogen or other reactive gases. The nanowires had dimensions of 2 μm to 20 μm in length, and a width of 50 nm to 500 nm.

The invention claimed is:

1. A method of producing nanowires that consist of or comprise semiconductor materials for applications in photovoltaics and electronics, produced from at least one precursor that constitutes compounds or mixtures of compounds each having at least one direct Si-Si and/or Ge-Si and/or Ge-Ge bond, with substituents that consist of halogen and/or hydrogen and with a composition in which an atomic ratio of substituents to metalloid atoms is at least 1:1, the method comprising reacting the at least one precursor or the at least one precursor and hydrogen at a precursor:hydrogen mixing ratio of 1:0 to 1:1,000,000, wherein less than 10% of pulverulent by-products occur in deposition of the nanowires.

2. The method according to preceding claim 1, wherein the deposition takes place in the absence of hydrogen in elemental or bonded form.

3. The method according to claim 1, conducted in a pressure range of 0.1-2200 hPa.

4. The method according to claim 1, wherein the deposition of the nanowires takes place at a temperature of 250° C. to 1100° C.

* * * * *